United States Patent
Pruszenski, Jr.

(10) Patent No.: US 6,917,635 B2
(45) Date of Patent: Jul. 12, 2005

(54) PRODUCING RADIATION OF A DESIRED FREQUENCY WITH MULTIPLE SOURCES

(76) Inventor: Anthony Stanley Pruszenski, Jr., 60 Prospect St., Newburyport, MA (US) 01950

( * ) Notice: Subject to any disclaimer, the term of this patent is extended or adjusted under 35 U.S.C. 154(b) by 309 days.

(21) Appl. No.: 10/261,336

(22) Filed: Sep. 30, 2002

(65) Prior Publication Data

US 2004/0061075 A1 Apr. 1, 2004

(51) Int. Cl.$^7$ ................................................ H01S 3/10
(52) U.S. Cl. ................................. 372/32; 372/20
(58) Field of Search .................. 372/32, 20, 21

(56) References Cited

U.S. PATENT DOCUMENTS

| | | |
|---|---|---|
| 3,719,822 A | 3/1973 | Javan et al. |
| 4,503,403 A | 3/1985 | Taylor et al. |
| 4,878,253 A | 10/1989 | Dixon, Jr. |
| 4,927,263 A | 5/1990 | de Groot et al. |
| 5,007,058 A | 4/1991 | Hayes et al. |
| H1081 H | 7/1992 | Dixon, Jr. |
| 5,206,868 A | 4/1993 | Deacon |
| 5,297,156 A * | 3/1994 | Deacon .................. 372/21 |
| 5,594,543 A | 1/1997 | de Groot et al. |
| 5,723,881 A | 3/1998 | Chen |
| 5,974,064 A | 10/1999 | Uchida |
| 6,108,109 A | 8/2000 | Chen et al. |
| 6,229,832 B1 | 5/2001 | Baba et al. |
| 6,304,585 B1 | 10/2001 | Sanders et al. |
| 6,560,253 B1 * | 5/2003 | Munks et al. .................. 372/32 |
| 6,650,667 B2 * | 11/2003 | Nasu et al. .................... 372/32 |
| 6,784,512 B2 * | 8/2004 | Yamaguchi et al. ........ 257/440 |
| 2001/0014106 A1 | 8/2001 | Gevorgian et al. |
| 2002/0018494 A1 | 2/2002 | Vieira et al. |
| 2002/0097755 A1 | 7/2002 | Mross et al. |

* cited by examiner

Primary Examiner—James Vannucci
(74) Attorney, Agent, or Firm—Lesley A. Hamlin; Thomas P. Grodt; Gregory Matthew McCloske (57) ABSTRACT

The present invention includes a method and system for producing radiation of a desired frequency with temperature invariance. Two or more radiation sources that produce an output are included. A temperature difference between the sources is sensed and a temperature difference signal is produced. A control unit controls a heat flux to one or more or between two or more of the sources based on the temperature difference signal. The control unit may provide the heat flux by self-heating by a supplied current or by heater/coolers. The outputs of the two or more radiation sources are mixed in or on a nonlinear medium. The mixing of the outputs produces beat frequencies and a desired beat frequency or frequencies may be selected by a resonant structure. The beat frequencies are invariant with fluctuations in ambient temperature.

57 Claims, 4 Drawing Sheets

PRODUCING RADIATION OF A DESIRED FREQUENCY WITH MULTIPLE SOURCES

BACKGROUND

Electromagnetic radiation ("radiation") is used in numerous ways and applications including for the transmission of signals and information in communication systems. The generation of radiation at certain frequencies is more difficult and costly than for the generation at other frequencies. As more and more complex communications systems have evolved, the need for precise control of the frequency and wavelength of the radiation generated for such systems has grown. This is particularly so for fiber optic communication systems that use lasers to generate optical carrier signals. In some fiber optic systems, such as wave-division multiplexing ("WDM") systems, which communicate information over optical fibers by pulses of laser light with multiple channels at different carrier frequencies, precise stabilization of the optical wavelengths within plus or minus 0.2 nanometers (nm) has long been required so that adjacent carrier signals do not interfere with one another. The proximity of the carrier signals in such systems is to some extent limited by the need to accommodate fluctuations in the temperature of the systems and their environments. Consequently, a need has arisen for precisely controlled and temperature invariant radiation sources of radiation of certain desired frequencies.

Because most materials change in size as they experience a change in temperature, components of a laser, including a laser resonator, typically experience a change in size as they are heated or cooled. Most materials used in the construction of laser resonators expand as they are heated, i.e., have a positive coefficient of thermal expansion. Consequently, most lasers experience a wavelength lengthening as the heat increases in the laser as it operates. The converse is true as well, namely that most lasers experience a wavelength shortening as they cool. The impact of such a change in wavelength may be significant for applications using radiation having a wavelength that is not much greater than the change in size of the resonator due to thermal expansion. For example, semiconductor diode lasers typically exhibit a wavelength lengthening of about 0.3 nanometers per degree Celsius. For a wavelength of 905 nanometers, which is a common wavelength for diode lasers, a change in temperature of one degree Celsius produces a change in output wavelength of 0.3 nanometers, which corresponds to a change in frequency of the output of the laser of approximately $1.0 \times 10^{18}$ Hertz (Hz) or $1.0 \times 10^{6}$ tera Hertz (THz). Such thermally induced changes in frequency may be unacceptable for many applications, especially when greater changes in temperature and the correspondingly greater shifts in frequency and wavelength occur.

Maintaining the output frequency and wavelength of a single optical wavelength laser diode by cooling and/or heating means is known, see for example U.S. Pat. No. 6,229,832, which discloses an "Optical Wavelength Stability Control Apparatus, Optical Transmitter and Multiple Wavelength Transmitter." These apparatus include one or more laser diode modules, which each have a laser diode and a photodiode to detect optical power from the laser diode. Each separate photodiode consequently diminishes the optical intensity of the system and adds to the complexity and cost.

Despite known methods for the temperature stabilization of single radiation sources, it has been particularly difficult to inexpensively produce radiation of certain frequencies and wavelengths including, for example wavelengths in the millimeter region of the spectrum, and particularly such radiation that is temperature-stabilized. Among other things, radiation in this region of the spectrum is useful in radar, radio telescope, and imaging applications.

Optical heterodyning has been seen as one way to produce millimeter wave radiation. Certain attempts have been made to couple the outputs of two or more laser sources to produce radiation at millimeter wavelengths. U.S. Pat. No. 5,007,058 discloses a "Millimeter Wave Power Generator" that combines two laser beams. The combined beam is diffracted into a plurality of externally powered, optical-to-millimeter wave transducers. A plurality of antennas is provided, one between each pair of adjoining optical-to-millimeter wave transducers. The antennas are parallel to each other, and each is driven by the optical-to-millimeter wave transducers at its ends. The back propagating millimeter wave radiation is reflected forward by a wire grid parallel to the antennas. The grid is situated between a diffractor and the optical-to-millimeter wave transducers, and is spatially tuned to constructively interfere the reflected back propagating wave with the forward propagating millimeter wave radiation. The use of a plurality of antennas and array of transducers add to the complexity and cost of the system. This arrangement is also susceptible to fluctuations in ambient temperature.

U.S. Patent Application Publication No. US2001/0014106A1 discloses an "Optical Electromagnetic Wave Generator" in which microwaves are generated by heterodyning the outputs of two or more optical lasers which have differing central frequencies to produce beat frequencies in the microwave range. One of the beat frequencies is used to modulate the output of at least one of the lasers to produce sidebands which differ from the central frequency by an integral number of the sideband frequency. Each laser is connected to one of the other lasers by a weak optical link to injection lock the laser to the sideband of the other laser. This configuration is susceptible to frequency drift of the outputs of the optical lasers arising from variations in ambient temperature.

SUMMARY OF THE INVENTION

The present invention, in general terms, includes two or more radiation sources ("sources") that produce coherent radiation. The sources are connected to a control unit by a temperature control loop. A temperature difference between two or more of the sources is sensed, either directly by a differential temperature sensor, or indirectly by temperature sensors and a comparator, and a temperature difference signal is produced. The control unit controls a heat flux to one or more or between two or more of the sources based on the temperature difference signal. The outputs of the two or more radiation sources are mixed or heterodyned in a nonlinear medium and beat frequencies are produced. Radiation of a desired beat frequency or frequencies may be selected. The temperature difference between the sources may be precisely controlled, e.g., maintained or varied, by the control unit by application of the heat flux. The desired beat frequency or frequencies may be selected by a resonant structure or by the material of the nonlinear medium. As a result, the production of the desired beat frequency or frequencies is invariant with fluctuations ambient temperature. A feedback loop may be present to control the desired beat frequency or frequencies. The radiation sources may include, but are not limited to, lasers and masers.

A first aspect of the present invention includes a system for producing radiation of a desired frequency with temperature invariance that includes a first source and a second source. The first source and the second source may be connected to a first temperature sensor and a second temperature sensor, respectively. The first temperature sensor detects a first temperature of the first source and produces a first temperature signal proportional to the first temperature. The second temperature sensor detects a second temperature of the second source and produces a second temperature signal proportional to the second temperature. The temperature sensors are each connected to a comparator, which is connected to a temperature control loop, and the comparator produces a temperature difference signal. The temperature control loop includes a control unit connected to the sources. The control unit controls a temperature difference between the sources by the application of a heat flux to one or more of the sources by self-heating or via heater/coolers. The outputs of the sources are mixed in a nonlinear medium creating beat frequencies.

In certain embodiments, a resonant structure may select a desired beat frequency or frequencies. The desired beat frequency or frequencies may be virtually stable despite fluctuations in ambient temperature or thermally induced frequency drift. The nonlinear medium or structure may include but are not limited to photodiodes or nonlinear surfaces of a target or object. In addition, the radiation sources may include but are not limited to lasers and masers. In some embodiments, a feedback loop connecting the nonlinear medium or resonant structure to the comparator may be present. The feedback loop may include a sensor that senses an attribute of one or more of the beat frequencies. The sensor may be connected to a phase-locked loop ("PLL") that provides an error signal to the comparator.

A second aspect of the present invention includes detecting a first temperature of a first source and a second temperature of a second source, with the first source having a first output and the second source having a second output. A first temperature signal and a second temperature signal that are proportional to the first temperature and second temperature, respectively, are produced. A temperature difference signal is determined from the first temperature signal and the second temperature signal. A heat flux is controlled and applied to at least one of the sources based on the temperature difference signal. A temperature difference between the first source and the second source is controlled and the first output and the second output may be mixed in a nonlinear medium. Beat frequencies are produced and a desired beat frequency may be selected. Feedback may be provided based on a sensed attribute of a desired beat frequency. The desired beat frequency may be varied, focused, transmitted, etc.

A third aspect of the present invention includes a system for producing temperature invariant radiation including at least two sources, each having an output frequency. A control unit is operable to receive a temperature difference signal related to a temperature difference between the sources. The control unit is also operable to control a heat flux to at least one of the sources. Certain embodiments include a differential temperature sensor connected to two or more of the sources. The differential temperature sensor may sense a temperature difference between two or more of the sources. In certain embodiments, a first temperature sensor may be connected to a first source and a second temperature sensor may be connected to a second source. The temperature sensors may produce a first and second temperature signals that a comparator uses to determine a temperature difference signal, which may be provided to the control unit.

A fourth aspect of the present invention includes a system for producing temperature invariant radiation including at least two laser diodes that each has an output. A control unit is operable to receive a temperature difference signal related to a temperature difference between the two laser diodes. The control unit is also operable to control a heat flux to at least one of the laser diodes. A plurality of substantially temperature invariant beat frequencies of the outputs of the laser diodes are included and may be produced in a nonlinear medium. Certain embodiments include a differential temperature sensor connected to two or more of the laser diodes. The differential temperature sensor may sense a temperature difference between two or more of the laser diodes. In certain embodiments, a first temperature sensor may be connected to a first laser diode and a second temperature sensor may be connected to a second laser diode. The temperature sensors may produce a first and second temperature signals that a comparator uses to determine a temperature difference signal, which may be provided to the control unit. In certain embodiments, the laser diodes may be on a common substrate.

A fifth aspect of the present invention includes sensing a temperature difference between at least two sources having outputs. A temperature difference signal related to the sensed temperature difference is produced and a heat flux to one or more of the sources is controlled. The outputs are mixed and temperature invariant beat frequencies are produced. In certain embodiments, the heat flux controlled may be from a first source to a second source and may include the use of a Peltier device. The temperature difference signal may be produced from a sensed differential temperature between at least two of the sources.

The present invention will become apparent from a review of the accompanying drawings and the following detailed description of preferred embodiments.

DETAILED DESCRIPTION

A temperature difference between radiation sources is controlled and one or more temperature invariant beat frequencies are produced by the system and method of the present invention. The present invention may be understood by the following description, which is by way of example only and is not meant to limit the scope of the present invention.

Figure 1:
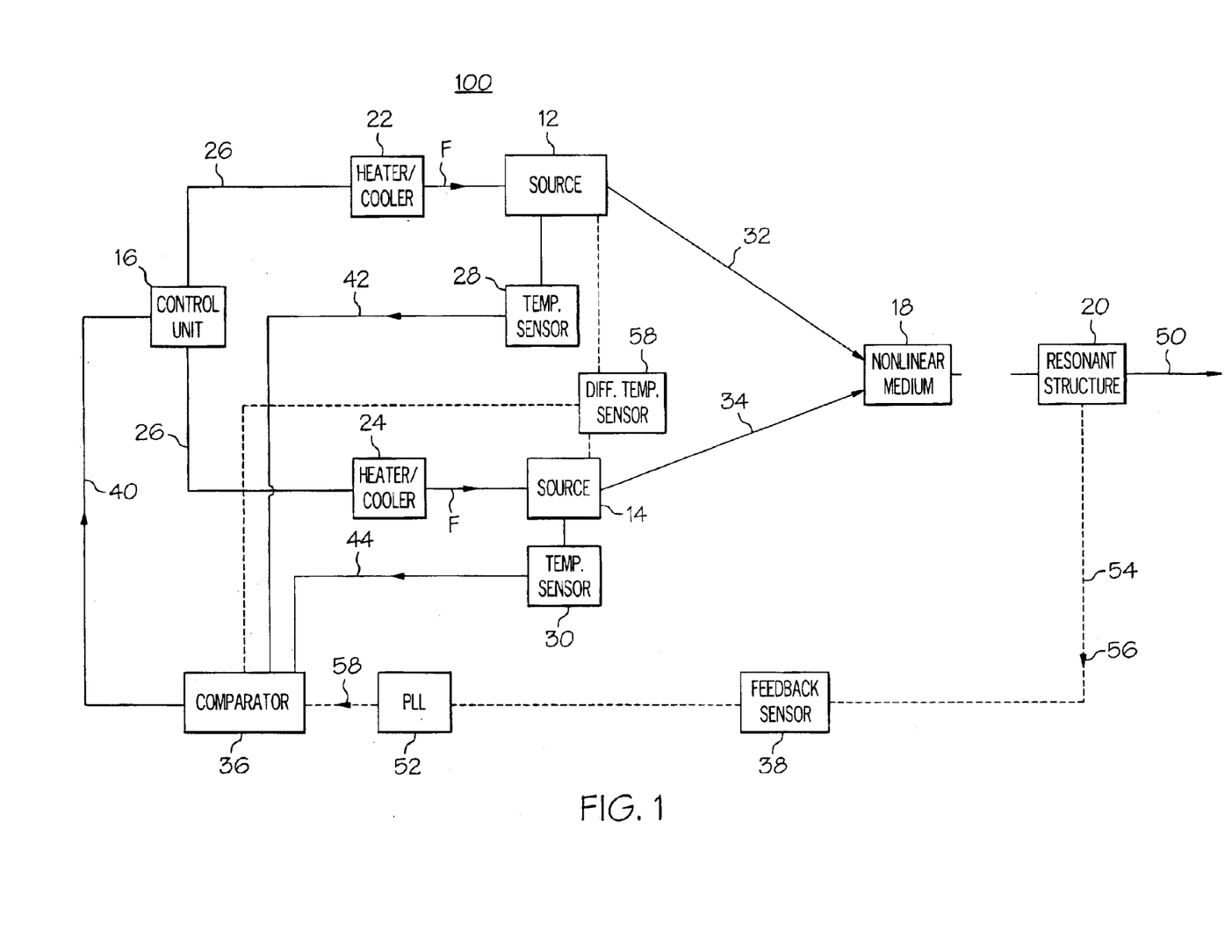
FIG. 1 shows in schematic form an embodiment of a system according to the present invention.

Referring to FIG. 1, a radiation generation system 100 according to an embodiment of the present invention is shown, in which feedback from a resonant structure may be used in the control of a temperature difference between radiation sources. A first radiation source ("first source") 12 and a second radiation source ("second source") 14 are shown connected by a temperature control loop 26 to a control unit 16. The control unit 16 controls a heat differential or heat flux F supplied to the first source 12 or the second source 14 or both. The radiation sources 12, 14 may be of any type that produces coherent radiation. Suitable examples include but are not limited to lasers, masers, klystrons, and functionally similar types of radiation sources. Suitable types of lasers useful as the radiation sources include but are not limited to solid state lasers, semiconductor lasers or laser diodes of all types including vertical cavity surface emitting lasers ("VCSELs") and edge-emitting lasers, liquid dye lasers, free electron lasers, and gas lasers. In preferred embodiments VCSELs or edge-emitting lasers are used as the sources. However, any suitable radiation source may be used and it should be understood that appropriate means for driving, pumping or energizing the sources, e.g., optical, thermal, electric, etc., will be present when alternative types of radiation sources are used.

With continued reference to FIG. 1, the control unit 16 controls a temperature difference between the sources 12, 14 by supplying and regulating the heat flux F to one or more of the sources 12, 14. The control unit 16 may be connected to a first heater/cooler 22 and a second heater/cooler 24 that are connected to the first source 12 and the second source 14, respectively. The control unit 16 may provide the heat flux F to one or more of the sources 12, 14 by means of self-heating, e.g., by supplying more or less current to the sources, or by temperature control devices or heater/coolers 22, 24. The heat flux F may be into or out of either or both of the sources 12, 14. Examples of suitable heater/coolers include but are not limited to Peltier devices, resistive or Ohmic heating elements, heat sinks, fans, heat pipes, combinations thereof, and the like. The first heater/cooler 22 and the second heater/cooler 24 may simply be leads that supply voltage and current to the sources 12, 14 and may additionally include suitable electronic components and circuitry to modify the supplied voltage or current or both.

The control unit 16 uses a temperature difference signal 40 to regulate the heat flux F supplied to the sources 12, 14. The temperature difference signal 40 may be determined by different methods and devices. For example, as shown by solid lines in FIG. 1, a first temperature sensor 28 that is connected to the first source 12 may be present. A second temperature sensor 30 connected to the second source 14 may also be present. The first temperature sensor 28 detects a first temperature of the first source 12 and produces a first temperature signal 42 that is related, e.g., proportional, to the first temperature. The second temperature sensor 30 detects a second temperature of the second source 14 and produces a second temperature signal 44 that is related to the second temperature. The temperature sensors 28, 30 are connected to a comparator 36 that receives the temperature signals 42, 44. In preferred embodiments the comparator 36 may be a sum junction, summing amplifier, or other functionally equivalent device. The comparator 36 produces the temperature difference signal 40 from the first and second temperature signals 42, 44 and the control unit 16 receives the temperature difference signal 40. The first and second temperature signals 42, 44 may be determined by various methods including, by way of example, measuring a voltage across each respective source while applying a known current to each, e.g., to the junction of a laser diode, or by measuring a voltage from a thermocouple, thermistor, or resistive thermal device (RTD), etc. When, as in preferred embodiments, the first source 12 and second source 14 are laser diodes, the temperature sensors may be connected to any two points of each laser diode. It will be understood that signal conditioning of temperatures signals will be used when appropriate.

In other embodiments, as shown in FIG. 1 by dashed lines, a differential temperature sensor 58 may directly sense a temperature difference or differential temperature between the sources 12, 14. The differential temperature sensor 58 determines the temperature difference signal and may provide the temperature difference signal to the comparator 36 or the control unit 16. In certain embodiments thermocouples connected in series to each source may be used as the differential temperature sensor 58.

A first output 32 having a frequency from the first source 12 is heterodyned or mixed with a second output 34 having a frequency from the second source 14 in a nonlinear medium 18, which can be any nonlinear device or nonlinear structure, and beat frequencies are produced. The resulting beat frequencies can be highly coherent. A desired beat frequency 50 or frequencies may be selected from the beat frequencies by various means, including by means of the material of the nonlinear medium 18 itself or by a resonant structure 20 that may be connected to the nonlinear medium 18, as shown in FIG. 1. The desired beat frequency may be a frequency that is difficult, costly, or inefficient to produce with only one radiation source, such as millimeter wave radiation.

The application of a heat flux, also referred to as differential temperature control, may be performed with milli-degree precision through techniques known in the art. By application of the heat flux F with such precision, the temperature difference between the sources 12, 14 can be controlled with milli-degree precision. As a result, the outputs 32, 34 and consequently the desired beat frequency or frequencies that are selected are precisely controlled and may be temperature invariant or virtually or substantially so, despite fluctuations in temperature of the surrounding environment or fluctuations in the temperatures of the sources 12, 14. The desired beat frequency or frequencies may thus constitute temperature invariant radiation. Factors that may influence the temperature invariance include the actual center frequency of the output of the source(s), the resolution of the temperature sensors, the control stability and thermal time constant of the heater/cooler, and the temperature sensitivity of the source(s).

One advantage that the present invention thus offers is the ability to maintain a desired beat frequency or frequencies by adding or removing a relatively small amount of heat to one of the sources 12, 14, the temperatures of which may "follow" or "float" with the ambient temperature as the temperature of the environment surrounding the system 100 changes. By adding or removing heat to one or both of the sources 12, 14 as the ambient temperature increases, the desired beat frequency or frequencies may be maintained more economically than if each source were to be maintained at a fixed temperature. The present invention also offers an advantage over the prior art in that the control unit may control a heat flux directly from one source to another. In preferred embodiments, the control unit may control a heat flux from one source, e.g., a laser diode, to another source via a Peltier device.

Examples of the nonlinear medium 18 include, but are not limited to, semiconductor photodiodes or transistors, semiconductor wave guides, photodetectors, frequency converters, parametric oscillators, parametric amplifiers, vacuum tubes, photo-multipliers, patch antennas, avalanche photodiodes and also nonlinear surfaces or structures of a material, target or object. In certain embodiments, the nonlinear medium 18 may be a photodiode with an active region that includes Indium Phosphide ("InP"), Silicon, Germanium, Gallium Arsenide, or Silicon Carbide. In other embodiments, the nonlinear medium 18 may be a Gallium Nitride Arsenide ("GaNAs") photodiode. In certain other embodiments the nonlinear medium 18 may be a photodiode with an active region that includes Indium Gallium Arsenide Phosphide ("InGaAsP"). In still other embodiments, the nonlinear medium 18 may be a photodiode having an active region with Indium Gallium Arsenide Phosphide Nitride/ Indium Phosphide ("InGaAsPN/InP") and suited for wavelengths near 1.65 mm. It will be understood that the term "photodiode" may include reference to an avalanche photodiode.

Examples of the resonant structure 20 include but are not limited to a tank circuit, an optical or microwave wave guide, or a filter, such as a tuning stub, a quarter-wave tuning stub, a half-wave open stub, a dielectric resonator, or a tank circuit made of discrete components suited for particular frequencies, e.g., those frequencies associated with the beat frequency or frequencies of interest. In preferred embodiments, the resonant structure 20 is designed to have a high quality factor, Q, which is measure of how quickly the energy stored within the resonant structure 20 is lost, so that high conversion efficiencies may be obtained. In embodiments having a high-Q resonant structure, the present invention provides an efficient apparatus and method of converting one type of radiation to another, e.g., optical radiation to millimeter wavelength radiation.

In certain embodiments, a feedback loop connecting the nonlinear medium and the comparator may be added. The feedback loop may sense an attribute of one or more of the beat frequencies and based upon the attribute may generate an error signal. The error signal may be used to adjust the temperature difference between the sources by the application of the heat flux so that a desired frequency profile may be obtained. One example of such a feedback loop 54 is shown in FIG. 1 by dashed lines. The feedback loop 54 may include a feedback sensor 38 that is coupled to the resonant structure 20. The feedback sensor 38 may detect one or more attributes 56, e.g., the frequency, phase, etc., of the beat frequencies produced in the nonlinear medium 18 and received in the resonant structure 20. The feedback sensor 38 is shown connected to a phase-locked loop ("PLL") 52 that is coupled to the comparator 36. The PLL 52 may function to lock the phase or frequency of the selected beat frequency or frequencies relative to that of one or more of the sources 12, 14. The PLL 52 may provide the error signal 58 to the comparator 36.

Figure 2:
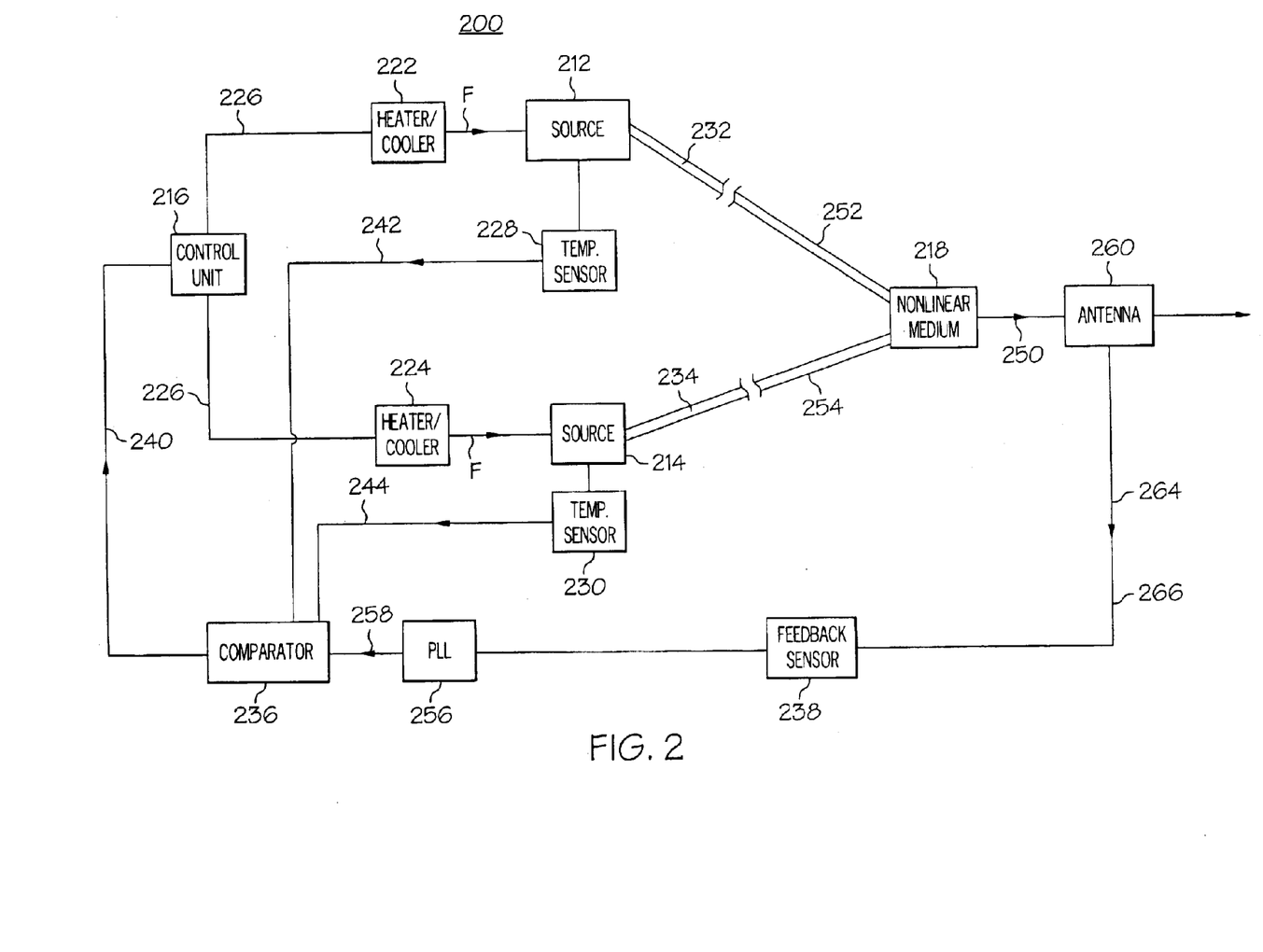
FIG. 2 shows in schematic form an alternate embodiment in which outputs of the first and second radiation source are coupled via optical fibers to a nonlinear medium coupled to an antenna.

Referring now to FIG. 2, a radiation generation system 200 according to an embodiment of the present invention is shown, in which feedback from a nonlinear medium may be used in the control of a temperature difference between radiation sources and a desired beat frequency or frequencies may be transmitted by an antenna. A first output 232 from a first source 212 and a second output 234 from a second source 214 are coupled to a nonlinear medium 218 by optical fibers 252 and 254, respectively. The first source 212 and the second source 214 are connected by a temperature control loop 226. The first output 232 and the second output 234 have frequency components and are mixed in the nonlinear medium 218 and beat frequencies are produced. A first temperature sensor 228 is connected to the first source 212, and a second temperature sensor 230 is connected to the second source 214. The first temperature sensor 228 detects a first temperature of the first source 212 and produces a first temperature signal 242 that is related, e.g., proportional, to the first temperature. The second temperature sensor 230 detects a second temperature of the second source 214 and produces a second temperature signal 244 that is related, e.g., proportional, to the second temperature. A comparator 236 receives the first temperature signal 242 and the second temperature signal 244, compares them, and produces a temperature difference signal 240. The temperature difference signal 240 is received by a control unit 216 that is connected to sources 212, 214 by the temperature control loop 226. A temperature difference between the sources is controlled by the control unit 216. The control unit 216 may provide a heat flux F to one or more of the sources 212, 214 by means of self-heating, e.g., by supplying more or less current to the sources, or by temperature control devices or heater/coolers 222, 224. A resonant structure is not shown but can be present and the nonlinear medium 218 itself may act to select a desired beat frequency 250 by the material properties and design dimensions of the nonlinear medium 218, e.g., the material of the nonlinear medium 218 may be chosen based on the frequencies of radiation that it absorbs. An antenna 260 may be coupled to the nonlinear medium 218 to transmit the desired beat frequency 250. A feedback loop 264 may be present and may include a feedback sensor 238 that senses an attribute 266, e.g., the phase or frequency, or both, of the selected beat frequency 250. The feedback sensor 238 may be connected to a PLL 256. The PLL 256 may operate to provide an error signal 258 to the comparator 236 to control the output 250.

Figure 3:
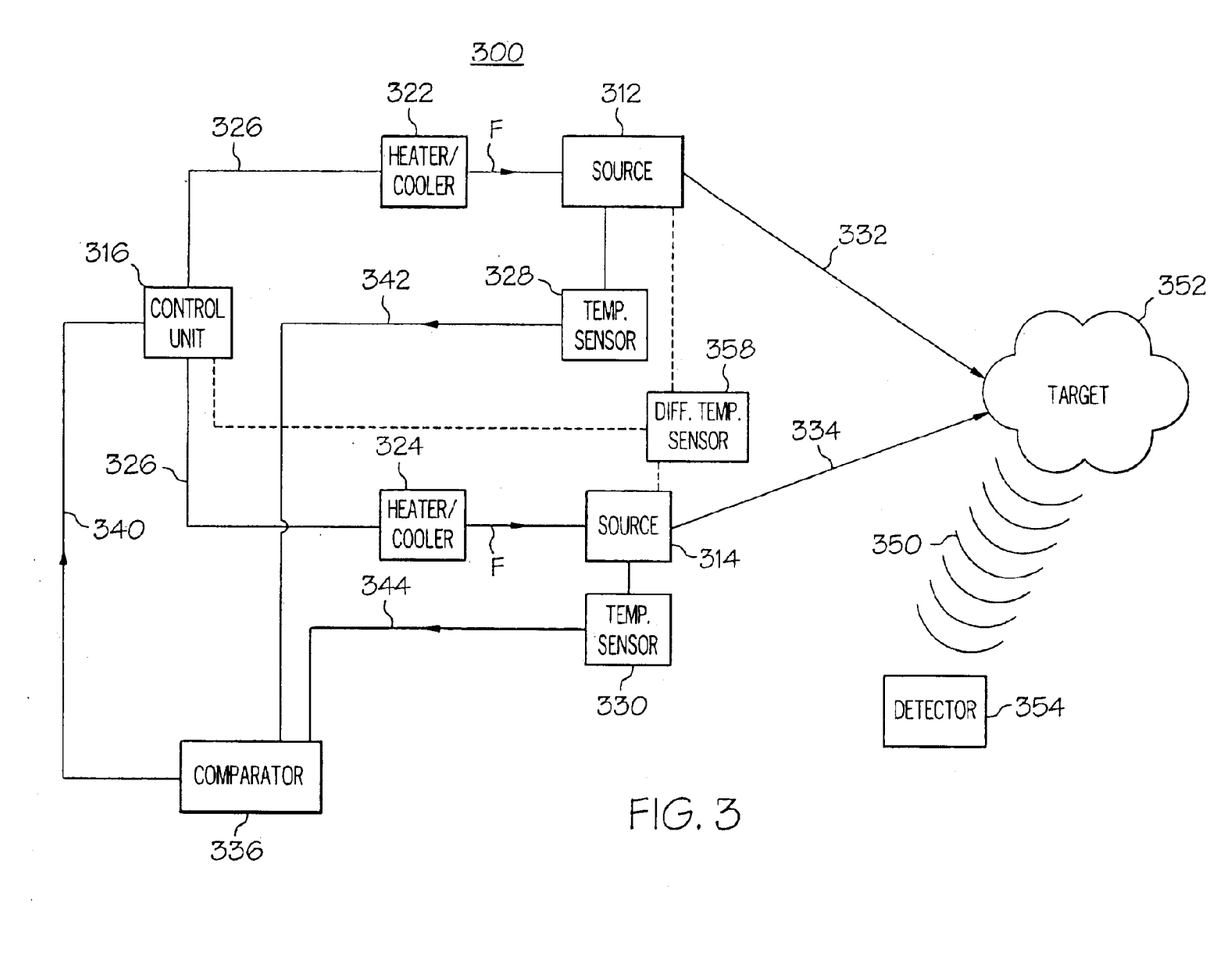
FIG. 3 shows in schematic form an alternate embodiment in which a nonlinear surface of a target object is utilized for the mixing of the first and second outputs.

With reference now to FIG. 3, an embodiment 300 of the present invention is shown in which a nonlinear surface or volume of an object or target 352 is utilized for mixing of a first output 332 of a first source 312 and a second output 334 of a second source 314. The first source 312 and the second source 314 are connected by a temperature control loop 326 to a control unit 316. A temperature difference between the sources is controlled by the control unit 316. The temperature difference between the sources may be determined by different means and devices. For example, an embodiment shown in FIG. 3 by solid lines includes a first temperature sensor 328 that is connected to the first source 312, and a second temperature sensor 330 that is connected to the second source 314. The first temperature sensor 328 detects a first temperature of the first source 312 and produces a first temperature signal 342 that is related, e.g., proportional, to the first temperature. The second temperature sensor 330 detects a second temperature of the second source 314 and produces a second temperature signal 344 that is related, e.g., proportional, to the second temperature. In the embodiment shown by solid lines, a comparator 336 receives the first temperature signal 342 and the second temperature signal 344, compares them, and produces a temperature difference signal 340. In the embodiment shown in FIG. 3 by dashed lines, a differential temperature sensor 358 senses a temperature difference between the sources and produces a temperature difference signal corresponding to the temperature difference. A comparator is not needed in this embodiment. The temperature difference signal 340, whether produced by the comparator 336 or by the differential temperature sensor 358, is received by the control unit 316. The control unit 316 may provide the heat flux F to one or more of the sources 312, 314 by means of self-heating, e.g., by supplying more or less current to the sources, or by temperature control devices or heater/coolers 322, 324.

The first output 332 and the second output 334 may be directed at the target 352 by any of various methods known in the art, including but not limited to beam steering and mechanical steering. A nonlinear surface on or nonlinear volume within the target 352 may provide a nonlinear medium to mix the first and second outputs 332, 334 and produce a beat frequency or frequencies. The beat frequency or frequencies may be reflected from or absorbed by the target 352. A detector 354, antenna, or receiver may receive the reflected beat frequency radiation. The detector 354 may include a resonant waveguide or tank circuit, which may select a desired beat frequency. The detector 354 may be connected to a computer (not shown) that may include a digital imaging program to facilitate in detection of the target 352. The detector 354 may be separate and positioned at a distance from the source 312, 314. In certain embodiments multiple sources may be assembled into an array so that beam steering of the outputs and subsequent scanning of a moving target may be performed. In certain embodiments, the outputs may actually mix inside of the target or object, for example in a material layer positioned within the target 352.

To further facilitate detection of the target 352, the heat flux F controlled by the control unit 316 and provided to one or more of the sources 312, 314 may be varied in a deliberate manner. The control unit 316 may, by known techniques, cause the temperature difference between the sources to be varied or "swept" in a deliberate manner through a range of values. Changing the operating temperature of one of the sources with respect to the other causes the frequency of the outputs of the sources to change in a corresponding manner. A change in the frequencies of the outputs causes a change in the beat frequencies that are produced when the outputs mix and are reflected off of the target. Because different materials absorb and reflect different frequencies to varying degrees and because varying conditions in the atmosphere, e.g., water vapor, temperature gradients, etc., affect radiation transmission, the deliberate varying or sweeping of the outputs and beat frequencies may facilitate detection of the target 352 by the detector 354.

Figure 4:
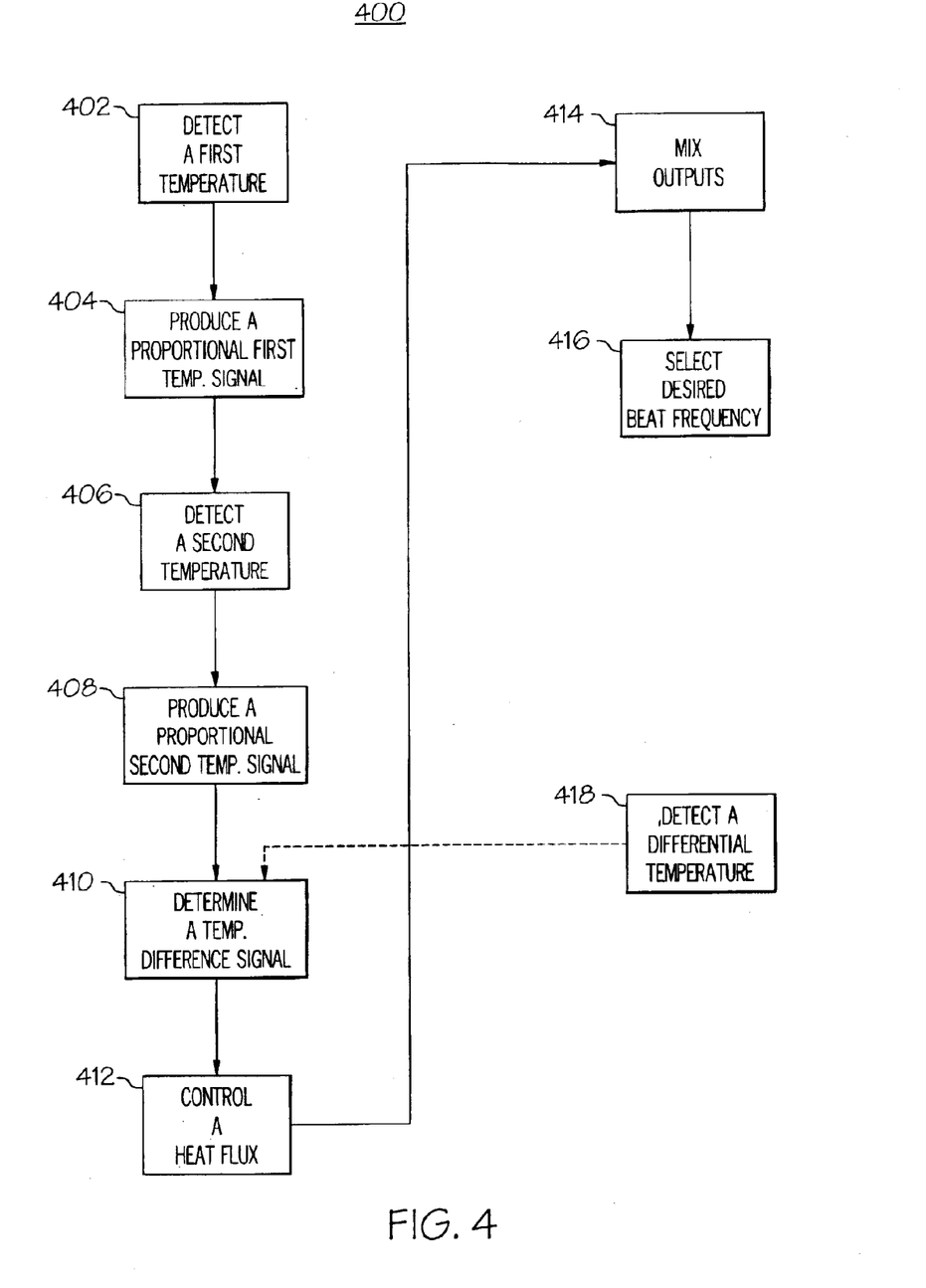
FIG. 4 is a block diagram showing the steps of a method for producing radiation of a desired frequency with temperature invariance according to an embodiment of the present invention.

Referring now to FIG. 4, a method 400 for generating a temperature invariant frequency according to the present invention will now be described. A first temperature of a first radiation source is detected 402, and a first temperature signal that is proportional to the first temperature is produced 404. A second temperature of a second radiation source is detected 406, and a second temperature signal that is proportional to the second temperature is produced 408. A temperature difference signal is determined 410 from the first and second temperature signals. A comparator or other similar structure may produce the temperature difference signal. A heat flux provided to one or both of the first and second sources is controlled 412 by the temperature difference signal. The step of controlling 412 the heat flux may be performed by a control unit receiving the temperature difference signal. The outputs of the first and second sources are mixed 414. Mixing may occur in for example a nonlinear medium, device, chemical precursor, moving or stationary target, etc. The mixing produces beat frequencies and a desired beat frequency is selected 416. The desired beat frequency may be selected 416 by various ways, examples of which include but are not limited to, using a tank circuit or other resonant structure. In certain embodiments, the steps 402 through 408 may be replaced or supplemented by a step of detecting a differential temperature 418 between two or more sources as shown in FIG. 4 by dashed lines. It should be understood that the foregoing steps may occur in any order within the scope of the present invention.

The step of controlling the heat flux may also include providing feedback from the desired beat frequency or frequencies to the control unit to affect the heat flux provided to the sources. The step of controlling may include varying the temperature difference signal and temperature difference, which may vary a desired beat frequency or frequencies. The desired beat frequency may be transmitted by known techniques. The step of transmitting may include focusing the beat frequency. The beat frequency may be detected after it is reflected from a target or object. In addition, the absorption of a beat frequency known to have been produced may also be detected from beat frequency radiation reflected from a target. Targets or objects may be of any kind. Suitable examples include, but are not limited to, buried mines, lethal hardware, e.g., bombs, guns, knives, and substances concealed on people or in cargo, mineral and petroleum deposits, etc.

While particular embodiments of the invention have been described, the foregoing is merely by way of example. It will be apparent to one skilled in the art that various changes, modifications, and substitutions may be made without departing from the spirit and scope of the present invention as defined in the following claims. For instance, while the term "temperature difference signal" has been used, such a signal may in fact be any linear combination of the temperature signals produced by the temperature sensors, not necessarily the difference between them. Additionally, while the embodiments and illustrations described above have included two radiations sources, any number of sources may be used within the scope of the present invention. Further for example, while the foregoing description has made reference to diode lasers as radiation sources, any suitable radiation source may be used. Furthermore, the present invention is not limited by size. The radiation sources and medium may be fabricated and integrated on a substrate by known techniques and connected by waveguides or light-pipes. Suitable techniques for such integration on a substrate may include but are not limited to semiconductor fabrication techniques such as molecular be epitaxy ("MBE") and metal-organic chemical vapor deposition ("MOCVD") as well as those used for micro-electromechanical systems ("MEMS").

It will be apparent to one skilled in the art that present invention offers itself to numerous applications. For example, through selection of a beat frequency or frequencies corresponding to absorption or reflection properties of various materials or structures, the present invention may be used for among other things the detection of mines and other objects buried in the ground, the mapping and surveying of natural and artificial resources, welding, and the production or synthesis of chemicals.

What is claimed is:

1. A system for producing radiation of a desired frequency with temperature invariance comprising:

a first source producing a first output having a first frequency;

a first temperature sensor connected to said first source, said first temperature sensor sensing a first operating temperature of said first source and producing a first temperature signal proportional to said first operating temperature;

a second source producing a second output having a second frequency;

a second temperature sensor connected to said second source, said second temperature sensor sensing a second operating temperature of said second source and producing a second temperature signal proportional to said second operating temperature;

a comparator, connected to said first temperature sensor and said second temperature sensor, said comparator producing a temperature difference signal from said first temperature signal and said second temperature signal;

a control unit receiving said difference control signal from said comparator, said control unit producing a temperature difference control signal;

a heater/cooler connected to said first radiation source, said heater/cooler receiving said temperature difference control signal from said control unit, said heater/cooler operative to adjust said temperature of said first radiation source as a function of said temperature difference control signal, wherein said temperature difference between said first and second sources is maintained at a predetermined level; and a nonlinear medium receiving said first output and said second output, wherein a plurality of beat frequencies are produced.

2. The system of claim 1, wherein said first source is a laser diode.

3. The system of claim 1, wherein said first radiation source is a maser.

4. The system of claim 2, wherein said second source is a laser diode.

5. The system of claim 1, wherein said comparator is a sum junction.

6. The system of claim 1, wherein said first temperature sensor is a thermocouple.

7. The system of claim 6, wherein said second temperature sensor is a thermocouple.

8. The system of claim 1, wherein said first temperature sensor is a thermistor.

9. The system of claim 8, wherein said second temperature sensor is a thermocouple.

10. The system of claim 1, wherein said at least one heater/cooler includes a resistor.

11. The system of claim 1, wherein said at least one heater/cooler includes a heat sink.

12. The system of claim 1, wherein said nonlinear medium is a proustite crystal.

13. The system of claim 1, wherein said nonlinear medium is a photodiode.

14. The system of claim 13, wherein said photodiode includes an active region including InP.

15. The system of claim 13, wherein said photodiode includes an active region including InGaAsP.

16. The system of claim 13, wherein said photodiode includes an active region including InGaAsP/InP.

17. The system of claim 1, further comprising a feedback sensor coupled to said nonlinear medium, said feedback sensor sensing an attribute of at least one of said plurality of beat frequencies and producing an attribute signal, said feedback sensor being operatively coupled to said comparator.

18. The system of claim 1, wherein said at least one heater/cooler includes a resistive heating element.

19. A system for producing radiation of a desired frequency with temperature invariance comprising:

a first source producing a first output having a first frequency;

a first temperature sensor connected to said first source, said first temperature sensor sensing a first operating temperature of said first source and producing a first temperature signal proportional to said first operating temperature;

a second source producing a second output having a second frequency;

a second temperature sensor connected to said second source, said second temperature sensor sensing a second operating temperature of said second source and producing a second temperature signal proportional to said second operating temperature;

a comparator, connected to said first temperature sensor and said second temperature sensor, said comparator producing a temperature difference signal from said first temperature signal and said second temperature signal;

a control unit receiving said difference control signal from said comparator, said control unit producing a temperature difference control signal; a heater/cooler connected to said first radiation source, said heater/cooler receiving said temperature difference control signal from said control unit, said heater/cooler operative to adjust said temperature of said first radiation source as a function of said temperature difference control signal, wherein said temperature difference between said first and second sources is maintained at a predetermined level; and a nonlinear medium receiving said first output and said second output, wherein a plurality of heat frequencies are produced; and a resonant structure, wherein said resonant structure operates to select a desired beat frequency from said plurality of beat frequencies.

20. The system of claim 19, wherein said resonant structure is operatively coupled to said nonlinear medium.

21. The system of claim 19, wherein said resonant structure is a tank circuit.

22. The generation system of claim 19, wherein said resonant structure is a quarter-wave tuning stub.

23. The system of claim 19, wherein said resonant structure is a detector, wherein said detector is remote from said nonlinear medium, and wherein said nonlinear medium is a nonlinear surface of a target.

24. The system of claim 23, further comprising a phase-locked loop (PLL) operatively coupled between said feedback sensor and said comparator, said PLL receiving said attribute signal and producing an error signal, said error signal being received by said comparator, wherein said temperature difference is controlled based on an attribute of at least one of said plurality of beat frequencies.

25. The system of claim 19, further comprising a feedback sensor coupled to said resonant structure, said feedback sensor sensing an attribute of said desired beat frequency and producing an attribute signal, said feedback sensor being operatively coupled to said comparator.

26. The system of claim 25, further comprising a phase-locked loop (PLL) operatively coupled between said feedback sensor and said comparator, said PLL receiving said attribute signal and producing an error signal, said error signal being received by said comparator, wherein said temperature difference is controlled based on an attribute of said desired beat frequency.

27. A method for producing radiation of a desired frequency with temperature invariance comprising the steps of:

detecting a first temperature of a first source having a first output;

producing a first temperature signal that is proportional to said first temperature;

detecting a second temperature of a second source having a second output;

producing a second temperature signal that is related to said second temperature;

determining a temperature difference signal from said first temperature signal and said second temperature signal;

adjusting a heater/cooler unit coupled to said first source as a function of said temperature difference signal, wherein the temperature difference between said first and second sources is maintained at a predetermined value;

mixing said first output and said second output in a nonlinear medium, wherein beat frequencies are produced; and selecting a desired beat frequency.

28. The method of claim 27, further including sensing an attribute of said desired beat frequency.

29. The method of claim 28, further including providing feedback based on said sensed attribute.

30. The method of claim 29, further including varying said temperature difference.

31. The method of claim 30, further including varying said desired beat frequency.

32. The method of claim 27, further including transmitting said desired beat frequency.

33. The method of claim 32, further including focusing said desired beat frequency.

34. The method of claim 32, further including transmitting said desired beat frequency to a target.

35. The method of claim 27, further including transmitting said first output and said second output to a target, wherein said mixing occurs at said target.

36. The method of claim 35, wherein said mixing further includes mixing on a nonlinear surface of a target.

37. The method of claim 36, wherein said mixing further includes mixing in a nonlinear layer of a target.

38. The method of claim 37, further including welding a layer of a target.

39. The method of claim 27, further including transmitting said first output and said second output to a buried object.

40. The method of claim 35, further including detecting a desired beat frequency reflected by said target.

41. The method of claim 27, wherein said step of mixing is using a photodiode.

42. The method of claim 27, wherein said selecting a beat frequency is selecting a beat frequency in a giga Hertz (GHz) region of the frequency spectrum.

43. A system for producing temperature invariant radiation comprising:

at least two sources, each having an output frequency;

at least two temperature sensors each temperature sensor coupled to a respective one of at least two sources and operable to provide a temperature output signal; and a control unit operable to receive said at least two temperature output signals and to provide a temperature difference signal related to a temperature difference between said at least two sources and said control unit operable to control the heating and cooling of at least one of said at least two sources, wherein said temperature difference signal is maintained at a predetermined value.

44. The system of claim 43, wherein said heater/cooler is operative to provide heat to the at least one of said at least two sources.

45. The system of claim 43, wherein said heater/cooler is operative to cool the at least one of said at least two sources.

46. The system of claim 43, further comprising a differential temperature sensor connected to two or more of said at least two sources and to said control unit, said differential temperature sensor operable to sense a temperature difference between said two or more of said at least two sources and operable to produce said temperature difference signal.

47. The system of claim 43, further comprising:

a first temperature sensor connected to a first source of said at least two sources, said first temperature sensor sensing a first temperature of said first source and producing a first temperature signal;

a second temperature sensor connected to a second source of said at least two sources, said second temperature sensor sensing a second temperature of said second source and producing a second temperature signal; and a comparator connected to said first temperature sensor, said second temperature sensor, and said control unit, said comparator operable to receive said first temperature signal and said second temperature signal, said comparator further producing said temperature difference signal.

48. The system of claim 43, further comprising a nonlinear medium, wherein two or more of said plurality of beat frequencies are mixed in said nonlinear medium.

49. A system for producing temperature invariant radiation comprising:

at least two laser diodes, each of said having an output;

at least two temperature sensors each coupled to a corresponding one of at least two laser diodes and each operable to provide a temperature output signal and a control unit operable to receive said at least two temperature output signals and operable to provide a temperature difference signal related to a temperature difference between said at least two laser diodes and, said control unit operable to control a heating/cooling unit coupled to at least one of said at least two laser diodes, wherein the temperature difference signal is maintained at a predetermined level; and a nonlinear medium optically coupled to said at least two laser diodes and operative to receive an output from each, wherein said nonlinear medium is operative to mix said two or more outputs to mix said at least two outputs to form a plurality of beat frequencies, wherein said plurality of beat frequencies are substantially temperature invariant.

50. The system of claim 49, further comprising a substrate, wherein said at least two laser diodes are disposed on said substrate.

51. The system of claim 49, wherein said heating/cooling unit is coupled to both first and second laser diodes and wherein heat from a first laser diode of said at least two laser diodes is provided to a second laser diode of said at least two laser diodes in order to minimize the temperature difference therebetween.

52. The system of claim 51, wherein said heating/cooling unit is a Peltier device, wherein said heat transfer between said first and second sources occurs via said Peltier device.

53. The system of claim 49, further including a nonlinear medium, wherein said plurality of substantially temperature invariant beat frequencies are produced in said nonlinear medium.

54. A method for producing temperature invariant radiation comprising the steps of:

sensing a temperature difference between at least two sources having outputs;

producing a temperature difference signal related to said sensed temperature difference;

providing a control signal for controlling a heater/cooler unit coupled to one of said at least two sources, wherein the temperature difference signal is maintained at substantially a predetermined value;

mixing said outputs to form a plurality of beat frequencies, wherein said beat frequencies are substantially invariant.

55. The method of claim 54, said step of controlling a heater/cooler unit further including controlling a heater/cooler unit coupled to both first and second sources, wherein said heat from a first source of said at least two sources is provided to said second source of said at least two sources to minimize the temperature difference therebetween.

56. The method of claim 55, said heater/cooler unit is a Peltier device.

57. The method of claim 54, wherein said step of sensing a temperature difference includes sensing a differential temperature between at least two of said at least two sources.

* * * * *